(12) United States Patent
Li et al.

(10) Patent No.: US 11,404,336 B2
(45) Date of Patent: Aug. 2, 2022

(54) POWER MODULE WITH METAL SUBSTRATE

(71) Applicant: Infineon Technologies Austria AG, Villach (AT)

(72) Inventors: Wu Hu Li, Singapore (SG); Raphael Hellwig, Regensburg (DE); Olaf Hohlfeld, Warstein (DE); Martin Mayer, Nittendorf (DE); Ivan Nikitin, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 61 days.

(21) Appl. No.: 16/914,725

(22) Filed: Jun. 29, 2020

(65) Prior Publication Data

US 2021/0407873 A1 Dec. 30, 2021

(51) Int. Cl.
*H01L 21/56* (2006.01)
*H01L 23/31* (2006.01)
*H01L 23/498* (2006.01)
*H01L 23/14* (2006.01)
*H01L 21/48* (2006.01)

(52) U.S. Cl.
CPC .......... *H01L 23/142* (2013.01); *H01L 21/486* (2013.01); *H01L 21/565* (2013.01); *H01L 23/3121* (2013.01); *H01L 23/49827* (2013.01)

(58) Field of Classification Search
CPC ..... H01L 2924/181; H01L 2224/80898; H01L 2224/81898; H01L 24/48; H01L 21/56; H01L 21/565
See application file for complete search history.

(56) References Cited

U.S. PATENT DOCUMENTS

| 10,785,871 | B1 * | 9/2020 | Vinciarelli | H05K 1/116 |
| 2005/0104198 | A1 | 5/2005 | Takahashi | |
| 2009/0146272 | A1 | 6/2009 | Wieneke et al. | |
| 2010/0013085 | A1 * | 1/2010 | Oi | H01L 23/3121 257/E23.116 |
| 2015/0380335 | A1 * | 12/2015 | Takematsu | H01L 24/01 257/77 |

(Continued)

FOREIGN PATENT DOCUMENTS

| JP | S6132558 A | 2/1986 |
| JP | S6151948 A | 3/1986 |
| WO | 2014166692 A1 | 10/2014 |

*Primary Examiner* — Jaehwan Oh
*Assistant Examiner* — John M Parker
(74) *Attorney, Agent, or Firm* — Murphy, Bilak & Homiller, PLLC

(57) ABSTRACT

A method of forming a power semiconductor module includes providing a substrate of planar sheet metal, forming channels in an upper surface of the substrate that partially extend through a thickness of the substrate and define a plurality of islands in the substrate, mounting a first semiconductor die on a first one of the islands, forming a molded body of encapsulant that covers the substrate, fills the channels, and encapsulates the semiconductor die, forming a hole in the molded body and a recess in the upper surface of the substrate beneath the hole, and arranging a press-fit connector in the hole and forming a mechanical and electrical connection between an interior end of the press-fit connector and the substrate.

11 Claims, 11 Drawing Sheets

(56) References Cited

U.S. PATENT DOCUMENTS

| | | | | |
|---|---|---|---|---|
| 2016/0380366 A1* | 12/2016 | Onishi | ............... | H01L 29/7393 |
| | | | | 257/698 |
| 2019/0189553 A1* | 6/2019 | Hohlfeld | ................. | H01L 23/24 |
| 2019/0237372 A1* | 8/2019 | Roth | .................... | H01L 23/053 |

* cited by examiner

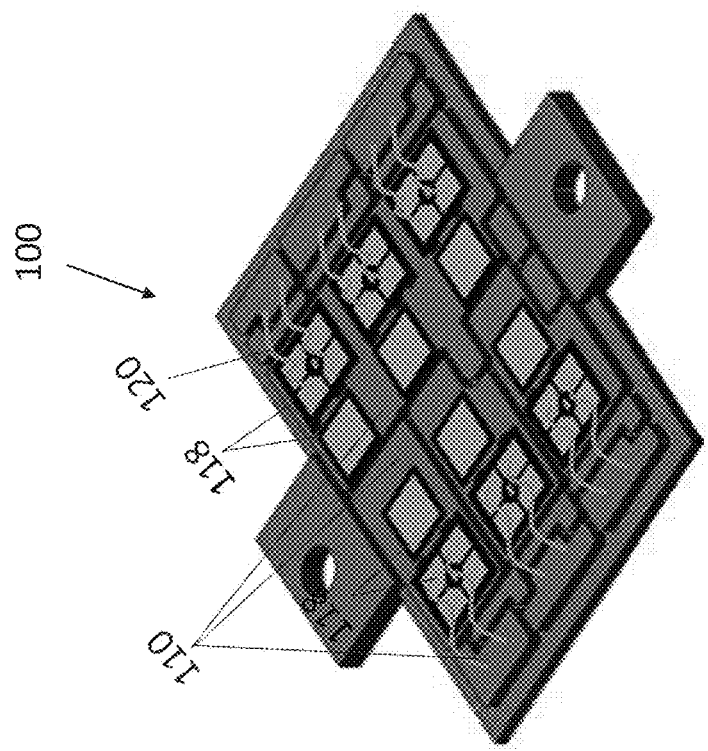
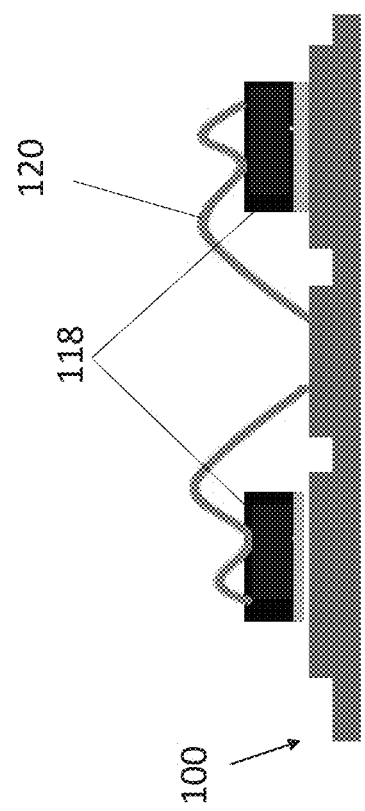
FIG. 3B
FIG. 3A
FIGURE 3

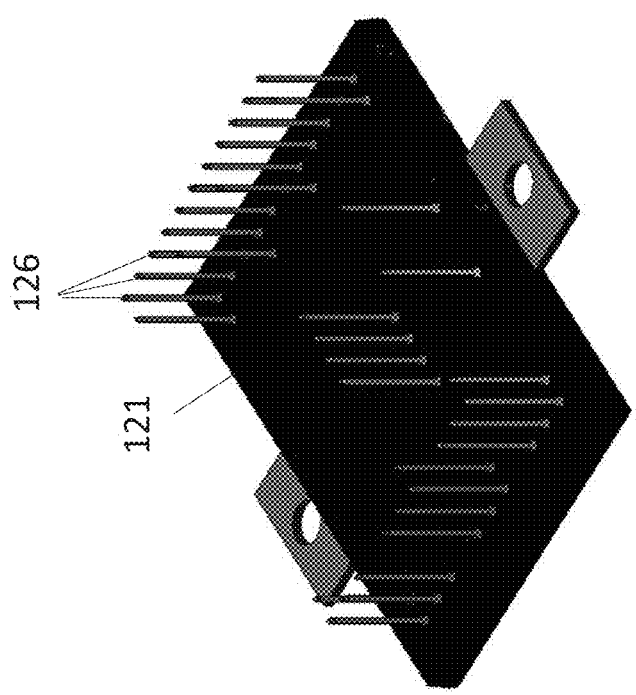
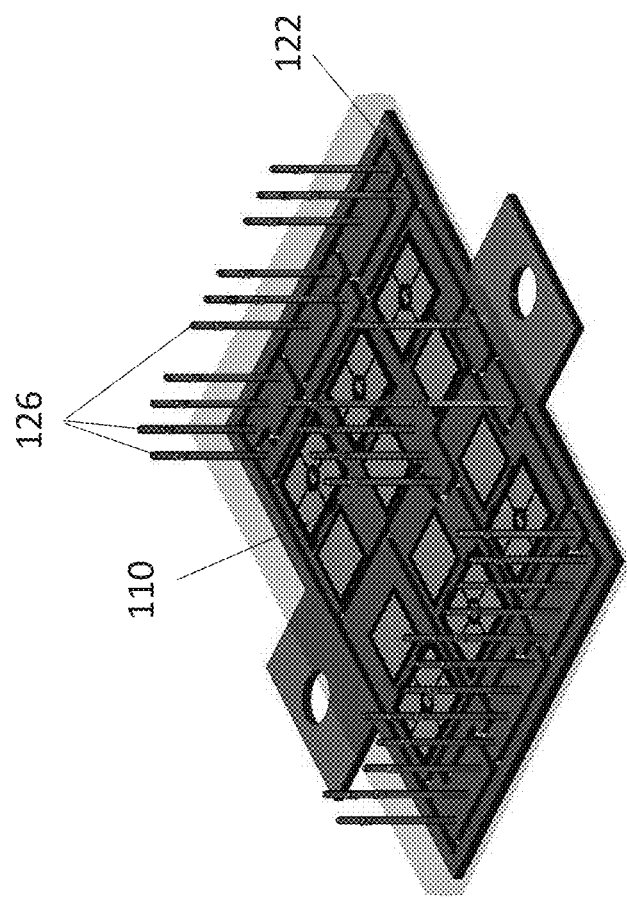
FIG. 6A
FIG. 6B
FIGURE 6

POWER MODULE WITH METAL SUBSTRATE

BACKGROUND

Semiconductor power modules are used in a wide variety of applications such as automotive, industrial motor drives, AC-DC power supplies, etc. Semiconductor power modules typically include multiple power semiconductor devices, e.g., power MOSFETs (metal-oxide semiconductor field-effect transistor), IGBTs (insulated gate bipolar transistors), HEMT (high electron mobility transistors), etc., along with other elements such as passive components, bond wires, etc., mounted on a common substrate. This substrate must be designed to withstand very high voltages and currents associated with the particular power application of the module.

One popular substrate configuration for semiconductor power modules is a so-called DCB (direct bonded copper) substrate. A DCB substrate includes a number of electrically isolated bond pads formed in a metallization layer of conductive material, such as copper. This metallization layer is bonded to a substrate of insulating material, such as ceramic.

The cost of producing semiconductor power modules with DCB substrates is driven by several factors. These factors include material costs (e.g., ceramic for the insulating layer, copper for the metallization layer, adhesive, etc.) and the time and expense associated with performing each processing step involved in the formation of the substrate, e.g., forming and bonding the layer of conductive metal to the insulating substrate, riveting press-fit connectors to the layer of conductive metal, etc.

It would be desirable to produce a produce a semiconductor power module at lower cost with similar or better performance characteristics than conventional solutions.

SUMMARY

According to an embodiment of a method of forming a power semiconductor module, the method comprises providing a substrate of planar sheet metal, forming channels in an upper surface of the substrate that partially extend through a thickness of the substrate and define a plurality of islands in the substrate, mounting a first semiconductor die on a first one of the islands, forming a molded body of encapsulant that covers the substrate, fills the channels, and encapsulates the semiconductor die, forming a hole in the molded body and a recess in the upper surface of the substrate beneath the hole, and arranging a press-fit connector in the hole and forming a mechanical and electrical connection between an interior end of the press-fit connector and the substrate.

Separately or in combination, forming the hole in the molded body and the recess in the upper surface comprises performing a single process step that completely penetrates the molded body and subsequently partially penetrates the substrate.

Separately or in combination, the single process step comprises mechanical or laser drilling.

Separately or in combination, forming the mechanical and electrical connection comprises welding the interior end of the press-fit connector to the substrate.

Separately or in combination, the method further comprises forming a spring contact attachment feature from the substrate, the spring contact attachment feature comprising a tab of the planar sheet metal and a perforation in the tab that completely extends through the thickness of the substrate, wherein the tab and the perforation protrude from the molded body of encapsulant after forming the molded body.

Separately or in combination, forming the channels comprises forming one of the channels as an outer peripheral ring that separates each one of the islands from peripheral edges of the substrate.

Separately or in combination, after forming the channels each one of the islands remain connected to one another by portions of the substrate that are directly beneath the channels, and the method further comprises removing the portions of the substrate after forming the molded body such that each one of the islands are electrically isolated from one another.

Separately or in combination, forming the channels comprises half-etching the upper surface of the substrate such that the portions of the substrate directly underneath the channels are thinner than the islands, and removing the portions of the substrate comprises selectively etching the lower surface of the substrate.

Separately or in combination, forming the channels comprises stamping the upper surface of the substrate such that the portions of the substrate directly underneath the channels are vertically offset from the islands, and removing the portions of the substrate comprises selectively etching the lower surface of the substrate.

Separately or in combination, forming the channels comprises stamping the upper surface of the substrate such that the portions of the substrate directly underneath the channels are vertically offset from the islands, and removing the sections of the substrate comprises planarizing the lower surface of the substrate.

Separately or in combination, the recess is formed in a second one of the islands, and the method further comprises mounting a second semiconductor die on a second one of the islands, forming a plurality of the holes in the molded body and a plurality of the recesses in the upper surface of the substrate beneath each of the respective holes, providing a plurality of the press-fit connectors, and arranging one of the press-fit connectors in each one of the holes and forming a mechanical and electrical connection between an interior end of each of the press-fit connectors and the substrate, the first and second semiconductor dies are configured as power transistors, and the press-fit connectors are configured as externally accessible points of electrical contact to each terminal of the first and second semiconductor dies.

According to an embodiment of a power semiconductor module, the power semiconductor module comprises a substrate of planar sheet metal comprising a plurality of islands that are each defined by channels that extend between upper and lower surfaces of the substrate, a first semiconductor die mounted on a first one of the islands, a molded body of encapsulant that covers the metal substrate, fills the channels, and encapsulates the first semiconductor die, a hole in the molded body that extends to a recess in the upper surface of the substrate, and a press-fit connector arranged in the hole such an interior end of the press-fit connector is mechanically and electrically connected to the substrate.

Separately or in combination, the power semiconductor module the interior end of the press-fit connector is welded to the substrate.

Separately or in combination, the interior end of the press-fit connector is secured within the recess by mechanical pressure.

Separately or in combination, the power semiconductor module further comprises a spring contact attachment feature formed in the substrate, the spring contact attachment feature comprising a tab of the planar sheet metal and a perforation in the tab that completely extends through the tab, and the tab and the perforation are exposed from the molded body.

Separately or in combination, one of the channels is arranged as an outer peripheral ring that separates each one of the islands from peripheral edges of the substrate.

Separately or in combination, the lower surface of the substrate is exposed at a lower surface of the molded body, and the power semiconductor module further comprises a layer of electrically insulating material that covers the lower surface of the substrate.

Separately or in combination, the recess is formed in a second one of the islands, wherein the first semiconductor die comprises a terminal which faces away from the upper surface of the substrate and is electrically connected to the second island by an electrical connector, and wherein the press-fit connector is configured as an externally accessible point of electrical contact to the terminal of the semiconductor die.

Separately or in combination, the power semiconductor module further comprises a second semiconductor die mounted on a second one of the islands, a plurality of the holes in the molded body and a plurality of the recesses in the upper surface of the substrate beneath each of the respective holes, a plurality of the press-fit connectors, one of the press-fit connectors is arranged in each one of the holes and forms a mechanical and electrical connection between an interior end of the respective press-fit connector and the substrate, the first and second semiconductor dies are configured as power transistors, and the press-fit connectors are configured as externally accessible points of electrical contact to each terminal of the first and second semiconductor dies.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes FIGS. 3A-3B, illustrates mounting semiconductor dies on islands formed in the substrate and electrically connecting the semiconductor dies to the substrate, according to an embodiment. FIG. 3A depicts a schematic cross-sectional view of the assembly, and FIG. 3B depicts a top side isometric view of the assembly.

FIGS. 4A-4C, illustrates forming a molded body on the substrate that encapsulates the semiconductor dies, according to an embodiment. FIG. 4A depicts a schematic cross-sectional view of the assembly, FIG. 4B depicts a top side isometric view of the assembly, and FIG. 4C depicts a bottom side isometric view of the assembly.

FIG. 6, which includes FIGS. 6A and 6B, illustrates arranging press-fit connector in the holes and the recesses, according to an embodiment. FIG. 6A depicts a top side isometric view of the assembly with the mold body being represented as transparent to show the encapsulated features, and FIG. 6B depicts a top side isometric view of the assembly with the mold body being opaque as is typically the case.

FIGS. 7A-7C, illustrate various techniques for processing the rear side of the substrate to form electrically isolated islands, according to an embodiment. FIGS. 7A and 7B depict selective etching techniques and FIG. 7C depicts a planarization technique.

DETAILED DESCRIPTION

A semiconductor power module construction and corresponding method for forming the semiconductor power module are described herein, according to various embodiments. Advantageously, the semiconductor power module can be produced with relatively few processing steps and with less expensive materials in comparison to other power semiconductor module constructions. For example, processing steps such as frame construction, press-fit soldering, and gel dispensing that are required in DCB based solutions are replaced with more cost-effective alternatives. The techniques utilized herein utilize a metal substrate the basic building block of the power semiconductor module. The metal substrate can be a planar sheet metal such as a panel or strip of copper that is commonly used to form lead frames or printed circuit boards. Each of the features of the power semiconductor module, e.g., isolated bond pads, press-fit connections, insulating materials, etc., can be formed using batch processing tools that can perform these steps to a panel or strip with multiple units being processed simultaneously. These processing steps are highly developed, well-suited for high volume parallelization, and utilize inexpensive materials that are widely available in the semiconductor industry.

Figure 1:
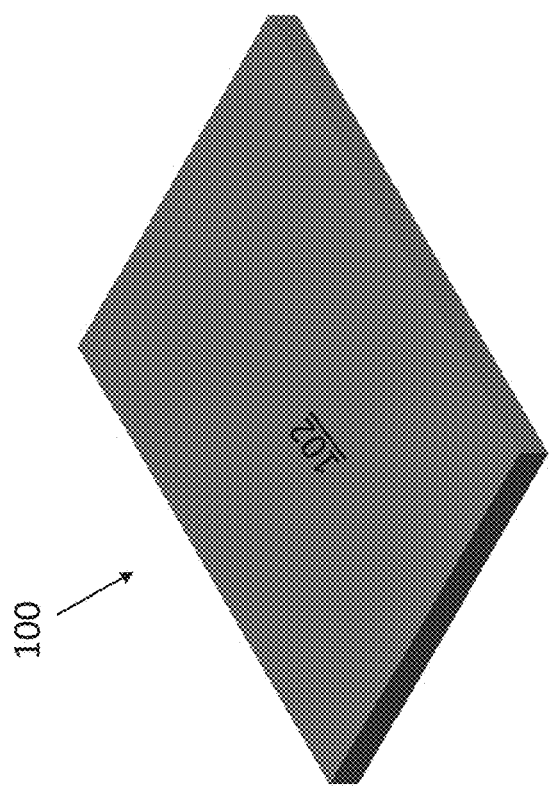
FIG. 1 illustrates a substrate of planar sheet metal, according to an embodiment.
Figure 1:
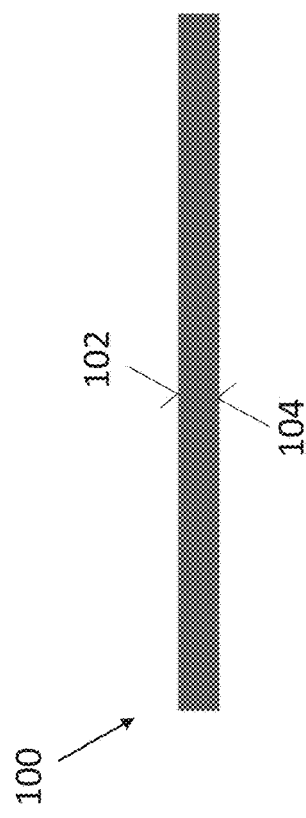

Referring to FIG. 1, a substrate 100 of planar sheet metal is provided. The substrate 100 can be a relatively uniform thickness piece of conductive metal with a generally planar upper surface 102 and a generally planar lower surface 104 that is opposite from the upper surface 102. The substrate 100 may be formed from one or more conductive metals such as Cu, Ni and/or Ag, for example. Additionally, the substrate 100 may include or be plated with Cu, Ni, Ag, Au, Pd, Pt, NiV, NiP, NiNiP, NiP/Pd, Ni/Au, NiP/Pd/Au, or NiP/Pd/AuAg, for example. Generally speaking, the substrate 100 can have a thickness as measured between the upper and lower surfaces 102, 104 in the range of 0.5 mm thick and 10 mm thick. In certain embodiments, the thickness of the substrate 100 is in the range of 1.0 mm thick and 2.0 mm thick.

Any type of metal substrate to which a semiconductor die is typically joined may be used for the metal substrate 100. For example, the substrate 100 can be a commercially available strip of metal used to form a leadframe or metal clip for semiconductor packages. In other embodiment, the substrate 100 is a large (e.g., 600 mm×600 mm) panel of metal used to form a printed circuit board. While the figures depict the steps used to form one power semiconductor module, it is to be understood that the techniques described herein can be performed in parallel to form multiple identical ones of the power semiconductor modules simultaneously. In particular, a large metal strip or panel can be used to provide multiple ones of the substrates 100 as shown in FIG. 1, and each processing step described hereafter can be performed in parallel to each unit.

Figure 2A:
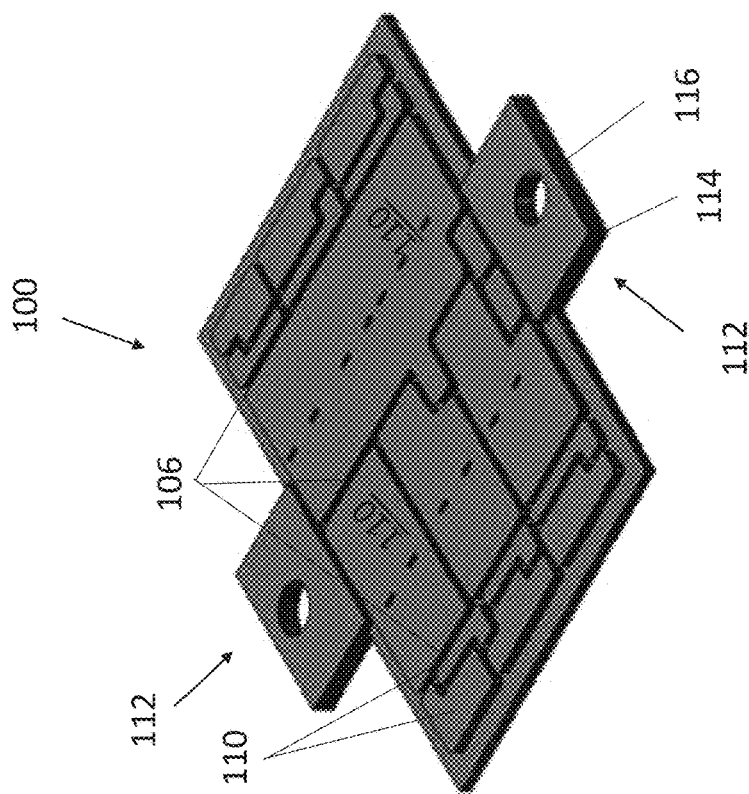
FIG. 2A illustrates forming channels in an upper surface of the substrate, according to embodiment.
Figure 2A:
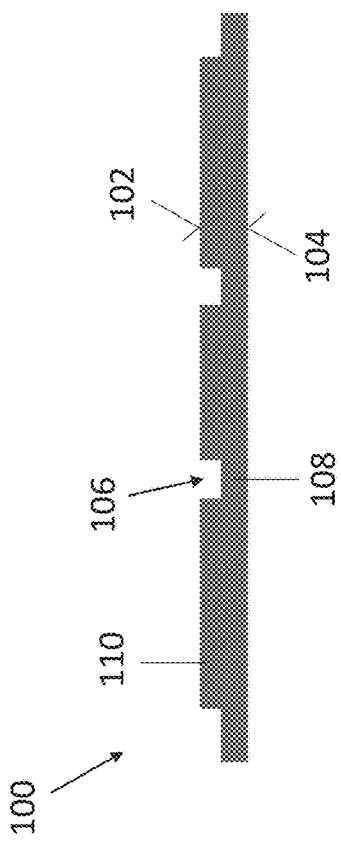

Referring to FIG. 2A, the substrate 100 is processed to form channels 106 in the upper surface 102 of the planar sheet metal. The channels 106 partially extend through a thickness of the substrate 100 so that portions 108 of the substrate 100 remain between bottoms the channels 106 and the lower surface 104 of the substrate 100. The channels 106 are formed to define a plurality of islands 108 in the substrate 100. This means that from a plan-view perspective of the upper surface 102 of the substrate 100 the channels 106 form enclosed shapes (e.g., circular, rectangular, etc.) with the islands 110 corresponding to the portions of the substrate 100 that are completely surrounded by the enclosed shapes.

Additionally, the substrate 100 is processed to form spring contact attachment features 112. The spring contact attachment feature 112 is used to affix the completed power semiconductor module to an external apparatus, such as a heat sink. The spring contact attachment feature 112 includes a tab 114 portion of the planar sheet metal that protrudes away from a main body section of the substrate 100 that includes the channels 106 and corresponding islands 110 enclosed by the channels 106. Additionally, the spring contact attachment feature 112 includes a perforation 116 in the tab 114 that completely extend through the thickness of the planar sheet metal. The perforation 116 is used to accommodate a fastener (e.g., a spring contact) to mount the power semiconductor module to an external apparatus.

The substrate 100 depicted in FIG. 2A can be formed using a half-etch technique. In one example of this technique, two masks are provided on both the upper and lower surfaces 102, 104 of the substrate 100. The mask disposed on the upper side 102 of the substrate 100 is patterned, e.g., using photolithography techniques, to have the desired geometry of the half-etched features (e.g., the channels 106) and (if desired) the fully-etched features (e.g., the tab 114 and the perforation 116). The mask disposed on the lower side 104 of the substrate 100 is patterned asymmetrically such that regions directly underneath the half-etched features are covered and the regions directly underneath the fully-etched features are exposed. The etching is controlled, e.g., through appropriate use of mask geometry, time, etchant chemical, etc., so that the etchant removes about one half of the thickness of the substrate 100 from either side. As a result, depth of the channels 106 is about one half of the thickness of the substrate 100, with remaining portions 108 of the substrate 100 underneath the channels 106 having about one half of the thickness of the substrate 100. Meanwhile, the etchant removes the complete thickness of the substrate 100 to form the tabs 114 and the perforations 116.

Figure 2B:
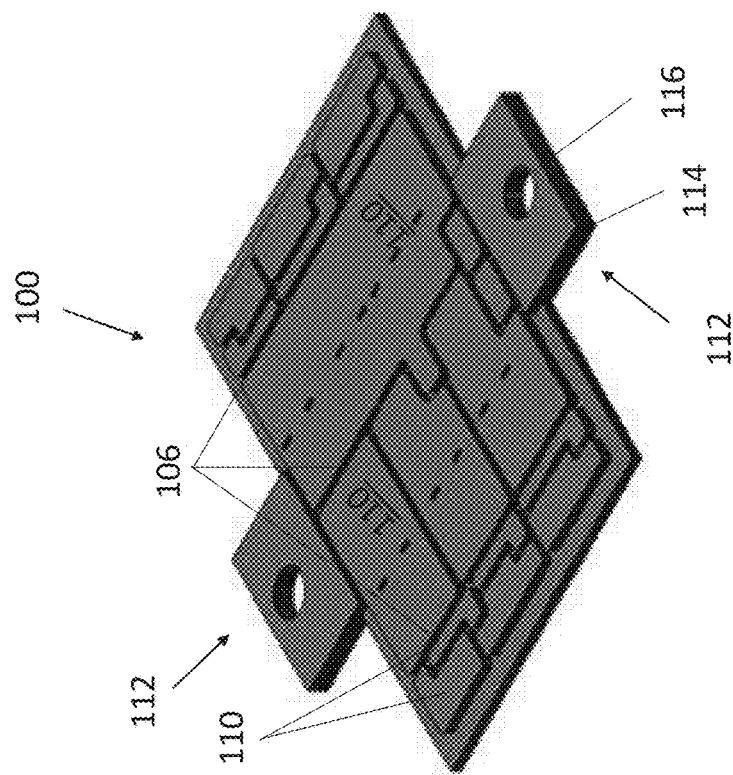
FIG. 2B illustrates forming channels in an upper surface of the substrate, according to another embodiment.
Figure 2B:
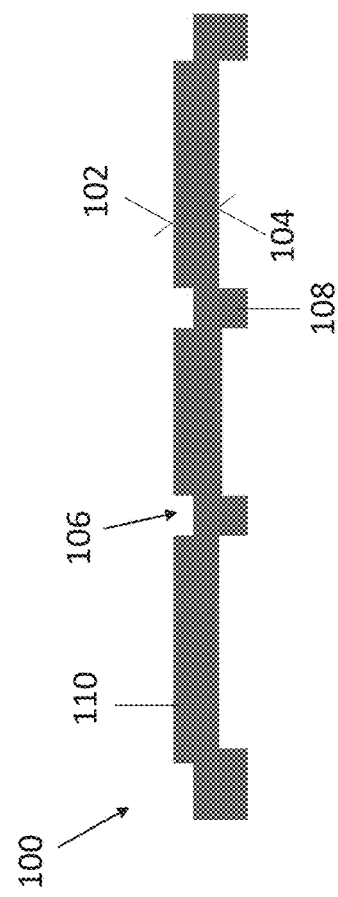

Referring to FIG. 2B, another technique for processing the planar sheet metal to form the channels 106 and the spring contact attachment feature 112 is depicted. In the embodiment of FIG. 2B, the channels 106 are formed by stamping the upper surface 102 of the planar sheet metal, e.g., by a metal punching or coining technique. These techniques can form the channels 106 to have the same enclosed geometry, thereby forming a plurality of the enclosed islands 110 in an identical manner. Different to the previously described half-etch technique, the portions 108 of the substrate 100 underneath the channels 106 are not half-thickness regions. Instead, these portions 108 have about the same thickness as the original thickness of the planar sheet metal and are vertically offset from the non-stamped regions. As a result, the lower surface 104 of the substrate 100 is undulated. The spring contact attachment feature 112 including the tab 114 and the perforation 116 can be formed concurrently with the channels 106, e.g., by performing a complete punch of the metal. Alternatively, the spring contact attachment feature 112 can be formed by a separate cutting process that is performed before or after the stamping process which forms the channels 106.

Referring to FIG. 3, a plurality of semiconductor dies 118 is mounted on the substrate 100. In the depicted embodiment of FIG. 3, the substrate 100 is a half-etched substrate 100 that was formed according to the technique described with reference to FIG. 2A. Alternatively, the substrate 100 can be a stamped substrate 100 formed according to the technique described with reference to FIG. 2B. With the exception of FIG. 6 which describes specific techniques for processing each kind of substrate 100, it is to be understood that each of the processing steps described hereafter are equally applicable to either kind of substrate 100.

In an embodiment, the semiconductor dies 118 are mounted by a soldering technique which forms an electrically conductive solder joint between a metal surface (e.g., a bond pad) of each semiconductor die 118 and the substrate 100. For example, a soft solder paste, e.g., a tin based lead-free solder paste comprising Sn/Ag, Sn/Ag/Cu, Sn/Cu, etc., can be provided between the metal surface of the semiconductor die and the upper surface 102 of the substrate 100 and subsequently reflowed to form a typical solder bond. In another example, the semiconductor dies 118 can be soldered by a diffusion process wherein the solder joint includes a high number of intermetallic phases with a higher melting point than the joined elements. This diffusion process can be performed providing a very thin (e.g., less than 30 μm thick) layer of solder (e.g., printed or preformed solder) between the metal surface of the semiconductor die and the upper surface 102 of the substrate 100 and subsequently reflowing the solder.

In an embodiment, the semiconductor dies 118 are configured as power devices that are designed to withstand very high voltages, e.g., 600V (volts), 1,200V, and/or substantially large currents, e.g., currents on the order of 1 A (amperes), 2 A, etc. Examples of these devices include power transistor dies, e.g., power MOSFETs, (metal-oxide semiconductor field-effect transistors), IGBTs (insulated gate bipolar transistors), HEMTS (high electron mobility transistors), etc. More generally, the semiconductor dies 118 can be configured as a logic dies such as a gate-drivers, microcontrollers, memory devices, etc., or passive dies such as inductors, capacitors, etc. The semiconductor dies 118 may have a lateral device configuration with each conductive terminal being disposed on an upper side of the die that faces away from the substrate 100. In that case, there is no electrical connection between the rear side of the semiconductor die 118 and the substrate 100, and the islands 110 may serve a non-electrical purpose, e.g., heat dissipation. Alternatively, the semiconductor dies 118 may have a vertical device configuration wherein the rear side of the semiconductor die 118 includes a conductive bond pad that is electrically connected to the upper surface 102 of the substrate 100, e.g., by a solder connection. In that case, the islands 110 can be configured as electrical terminals, e.g., drain, source, etc.

In the depicted embodiment of FIG. 3B, pairs of different semiconductor dies 118 are mounted adjacent to one another on a single one of the islands 110, These pairs of different semiconductor dies 118 may include a power transistor and a corresponding gate driver used to control each gate transistor, for example. Three of these pairs are mounted on one common island 110, and three of these pairs are mounted separate islands 110. This arrangement can be used for a half-bridge circuit, wherein the common island 118 that accommodates three pairs is configured as a common reference potential terminal, e.g., GND for each low-side switch, and the separate islands 110 that accommodate single pairs of the different semiconductor dies 118 are configured as high-voltage terminals, e.g., $V_{DS}$, for each high-side switch. This arrangement represents just one example of a variety of configurations wherein the geometry of the channels 106 is selected to provide a dedicated bond pad and terminal for the devices mounted thereon.

After mounting the semiconductor dies 118 on the substrate 100, an electrical interconnect step is performed to form electrical connections 120. The electrical connections 120 can form electrical interconnections between terminals of the semiconductor die which face away from the upper surface 102 of the substrate 100 and other islands 110 that do not include any semiconductor dies 118 mounted thereon and/or terminals of different semiconductor dies 118. For example, the electrical connections 120 may include an electrical connection between the source terminal of a power transistor and a separate island 110 that does not accommodate any semiconductor die 118. In another example, the electrical connections 120 may include an electrical connection between the gate terminals of a driver die and a separate island 110 that does not accommodate any semiconductor die 118. More generally, the separate islands 110 can be configured to provide pan-out redistribution for the different terminals of each semiconductor die 118. These electrical connections 120 may be formed using bond wires (as shown), metal clips, ribbons, etc. FIG. 3 depicts only some of the necessary electrical connections 120 for a power module being effectuated using conductive bond wires.

Figure 4:
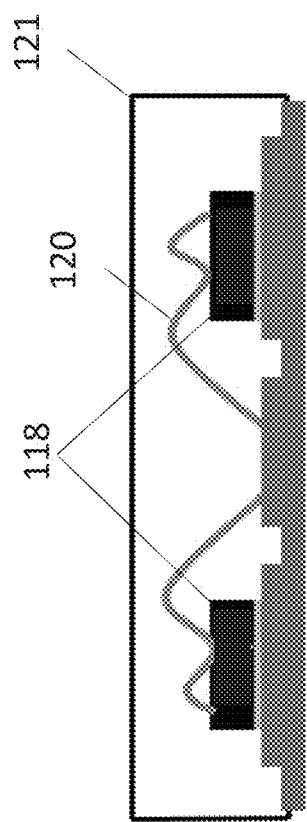
FIG. 4, which includes
Figure 4:
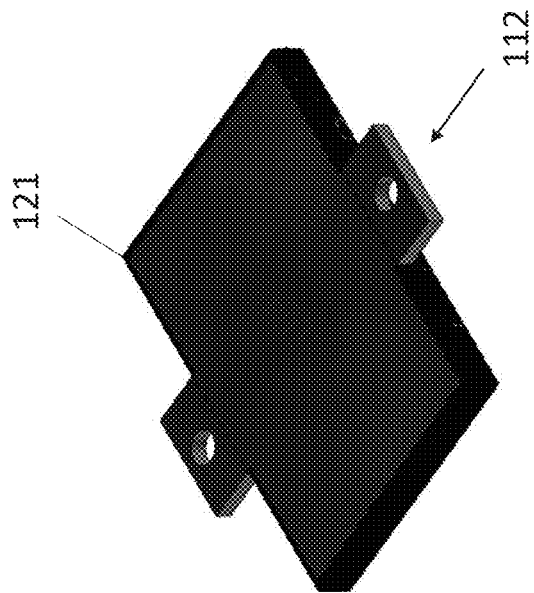
Figure 4:
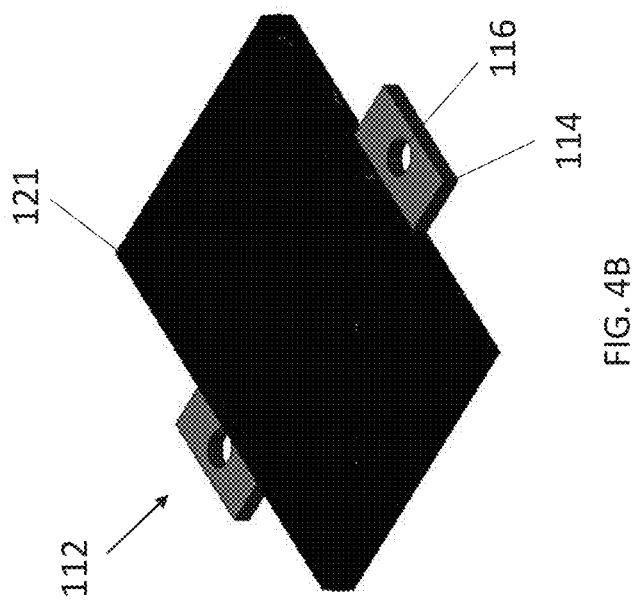

Referring to FIG. 4, an encapsulation process is performed on the assembly. The encapsulation process forms a molded body 121 of electrically insulating encapsulant material that covers the substrate 100, fills each of the channels 106, and encapsulates the semiconductor dies 118. Thus, the molded body 121 forms an insulative and protective structure that protects each semiconductor die 118 and the associated electrical connections 120. The molded body 121 can include a wide variety of electrically insulating encapsulant materials including ceramics, epoxy materials and thermosetting plastics, to name a few. In an embodiment, the molded body 121 is formed by placing the assembly in a three-dimensional chamber and injecting liquified encapsulant material into the chamber. Examples of these techniques include injection molding, transfer molding, and compression molding. In another embodiment, the molded body 121 is formed by a lamination technique.

The channels 106 may be formed to include a ring-shaped channel 122 (shown in FIG. 6A) that surrounds each one of the islands 110 and separates each one of the islands 110 from peripheral edges of the substrate 100. This ring-shaped channel 122 advantageously serves to enhance adhesion of the encapsulant material during the encapsulation process by providing additional interlocking surfaces between the encapsulant material and the substrate 100. More generally, this concept can be utilized to form extraneous channels 106 or other features that increase the available surface area of the substrate 100 that interact with of the encapsulant material.

The encapsulation process is performed such that the tab 114 of the planar sheet metal and the perforation 116 in the tab 114 which form the spring contact attachment feature 112 protrude from the molded body 121. Thus, these features are accessible for attachment in the completed module. Optionally, the tab 114 can be coated with molding compound in the same encapsulation step or in a further step. Moreover, as shown in the rear-side view of FIG. 4C, the lower surface 104 of the substrate 100 remains exposed from the molded body 121. In the case that the substrate 100 is a stamped substrate 100 (e.g., as described with reference to FIG. 2B), the complete lower surface 104 of the substrate 100 including the lower sides of the islands 110 and the vertically offset portions can be exposed from the molded body 121.

Figure 5:
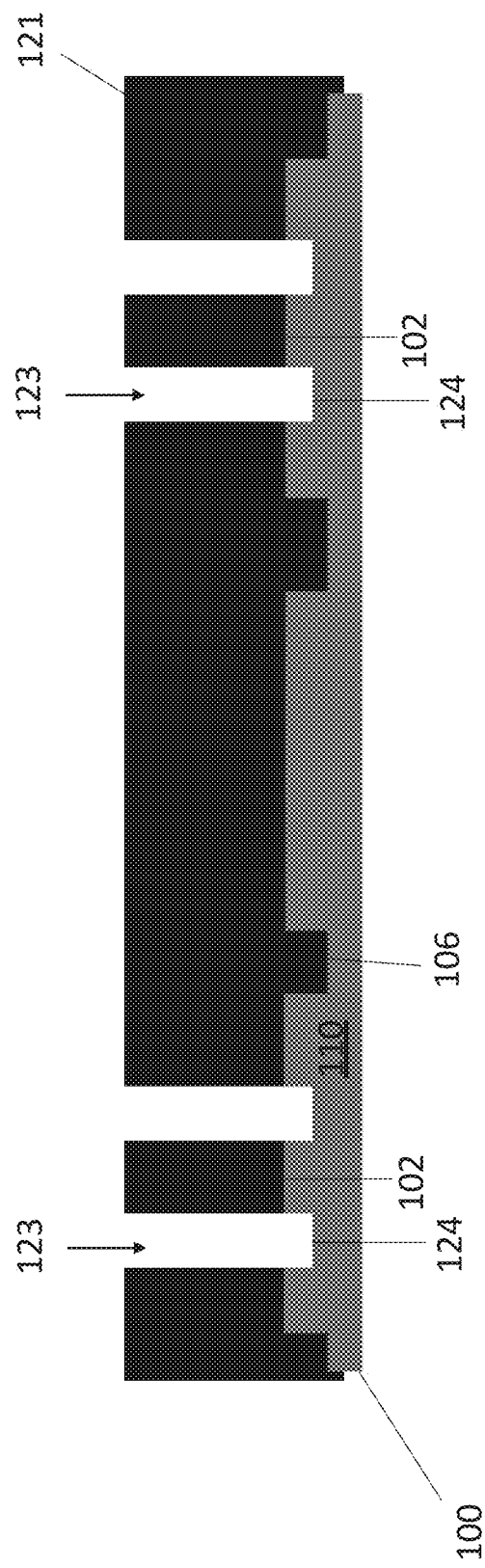
FIG. 5 illustrates forming holes in the molded body and corresponding recesses in the substrate underneath the holes, according to an embodiment.

Referring to FIG. 5, a plurality of holes 123 is formed in the molded body 121 and a plurality of recesses 124 is formed the upper surface 102 of the substrate 100. Each recess 124 is disposed beneath each of the respective holes 123. That is, a single perforation 116 that penetrates the molded body 121 and terminates within the substrate 100 is provided by a combination of one of the holes 123 and one of the recesses 124. These holes 123 and the corresponding recesses 124 can be formed in any one of the islands 110 including the islands 110 which accommodate the semiconductor dies 118 and the islands 110 that do not accommodate the semiconductor dies 118 and are electrically connected to the semiconductor dies 118.

According to an embodiment, the holes 123 in the molded body 121 and the corresponding recesses 124 in the upper surface 102 that are beneath each hole 122 are formed by a single process step that completely penetrates the molded body 121 and subsequently partially penetrates the substrate 100. For example, the single process step can include a mechanical drilling technique whereby a drill bit penetrates the molded body 121 and partially penetrates the substrate 100. In another embodiment, the single process step can include can include a laser drilling technique whereby highly concentrated energy is directed at the upper surface 102 of the module until the molded body 121 is penetrated and the substrate 100 is partially penetrated.

Referring to FIG. 6, press-fit connectors 126 are arranged in each one of the holes 123 such that a mechanical and electrical connection exists between interior ends of the press-fit connectors 126 and the substrate 100. The press-fit connectors 126 are electrically conductive structures that are designed to provide 1/O connectivity for a power semiconductor module. The press-fit connectors 126 may include an electrically conductive metal, e.g., Cu, Al, etc., and may include one or more layer of anticorrosion plating, e.g., Ni, Ag, Au, etc. The press-fit connectors 126 provide externally accessible points of electrical contact to the various terminals of the second semiconductor dies 118 via the electrical connections 120 contained within the molded body 121. The press-fit connectors 126 can be designed to provide a force-fitting connection with a circuit interface, such as a printed circuit board, by inserting distal ends of the press-fit connectors 126 into correspondingly shaped receptacles in the circuit interface. The mechanical connection between the press-fit connectors 126 and the substrate 100 is sufficiently force-resistant such that the press-fit connectors 126 are not easily removed by ordinary human pulling force and can be inserted and withdrawn from the receptacles of the circuit interface without breakage. Generally speaking, a diameter of the press-fit connectors 126 may be in the range of 0.5 mm-2 mm and may be 1 mm in a certain embodiment. The distal ends may of the press-fit connectors 126 may be designed to plastically deform and/or may include a spring-loaded contact mechanism to enhance I/O connectivity.

In an embodiment, the mechanical and electrical connection between the press-fit connectors 126 and the substrate 100 is provided by welding the interior ends of the press-fit connectors 126 to the substrate 100. More specifically, an electrical resistance welding technique can be performed whereby very large amounts of current are passed through the two elements, thereby generating sufficient heat to melt the metals and effectuate the weld. In another example, a laser welding technique can be performed whereby concentrated radiation, e.g., from a continuous or pulsed laser beam, is directed at the joining interface until sufficient heat is generated to melt the metals and effectuate the weld. More generally, any of a variety of welding techniques may be employed.

In an embodiment, the mechanical and electrical connection between the press-fit connectors 126 and the substrate 100 is provided without welding. For example, the recesses 124 can be dimensioned to have a diameter that is slightly less than the diameter of the press-fit connectors 126 (e.g., about 5-15% less) such press-fit connector 126 can be inserted in the recesses 124 and securely retained thereafter by mechanical pressure. In another example, the interior end of the press-fit connector 126 may include protruding features, e.g., ridges or threads, that engage with the sidewalls of the recess 124 in a similar manner as a screw or bolt.

In any of the above examples, the substrate 100 acts as an anchor point that provides substantial mechanical stabilization for each press-fit connector 126 and simultaneously provides electrical redistribution. Advantageously, no soldering or additional features such as pin rivets are needed to form the mechanical and electrical connection between the press-fit connectors 100 and the substrate 100.

Instead of forming the holes 123 in the molded body 121 subsequently attaching the press-fit connectors 126 to the substrate, the press-fit connectors 126 can be attached before forming the molded body 121. For example, the press-fit connectors 126 can be welded to the substrate 100 or attached to the substrate through mechanical means according to the above described techniques and the molded body 121 can be subsequently formed around the press-fit connectors 126.

Figure 7:
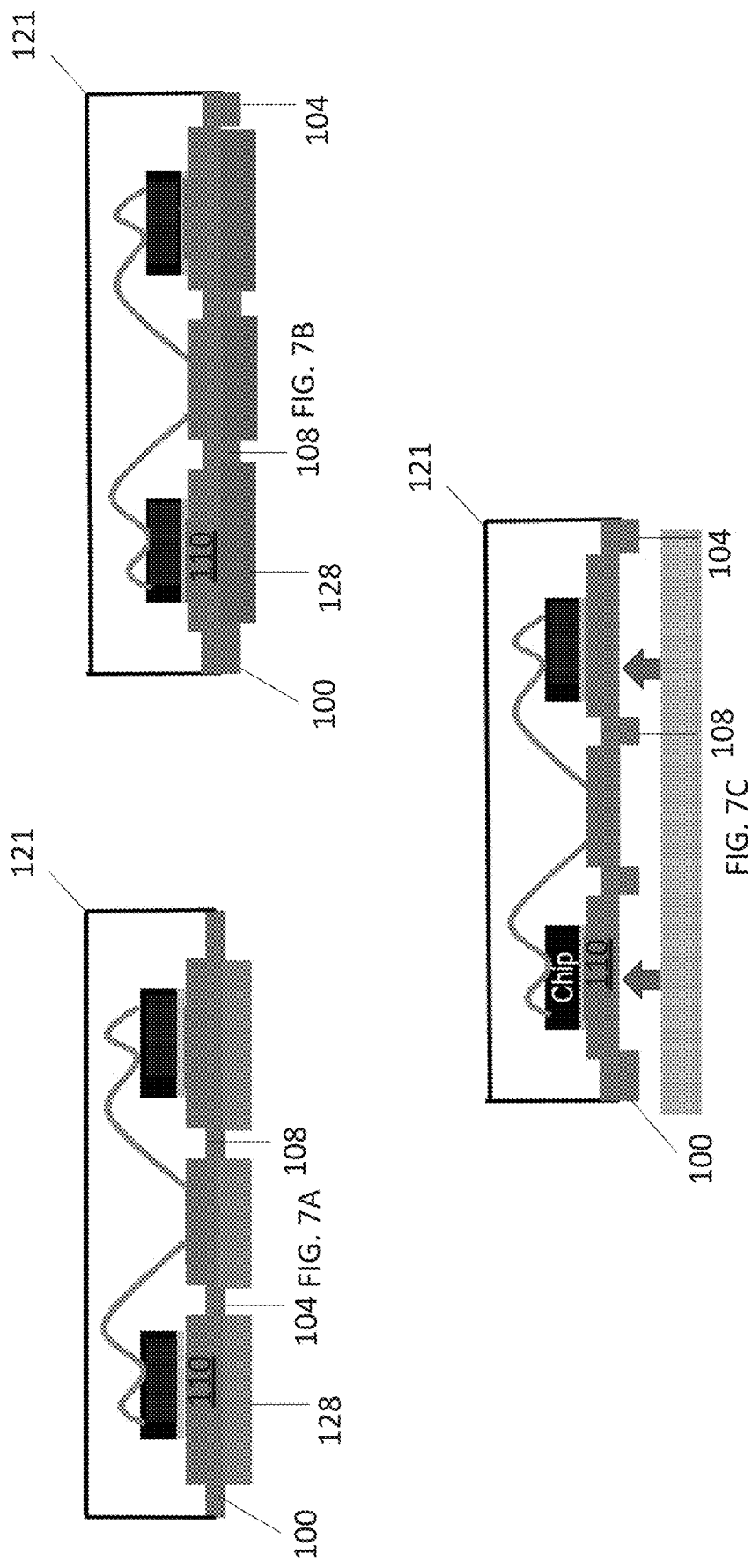
FIG. 7, which includes

Referring to FIG. 7, rear side processing steps for electrically isolating the islands 110 are shown. In either one of the techniques described with reference to FIG. 2, after forming the channels 106, each one of the islands 110 remain connected to one another by the portions 108 of the substrate 100 that are directly beneath the channels 106. In the case of the half-etching technique described with reference to FIG. 2A, these portions 108 of the planar sheet metal directly underneath the channels 106 are thinner than the islands 110. In the case of the stamping technique described with reference to FIG. 3A, these portions 108 of the planar sheet metal directly underneath the channels 106 are vertically offset from the islands 110 and have about the same thickness as the islands, 110. In either case, the process steps shown in FIG. 9 remove these portions 108 of the substrate 100 so as to eliminate any connection between adjacent islands 110, thereby forming isolated bond pads.

Referring to FIG. 7A, a selective etching technique is applied to the lower surface 104 of the substrate 100. In the embodiment of FIG. 7A, the substrate 100 is the half-etched substrate 100 that was formed according to the technique described with reference to FIG. 2A. According to this technique, a mask 128 is provided on the lower surface 104 of the substrate 100 and the portions of the substrate 100 exposed from the mask 128 are etched, e.g., in a similar manner as the half-etching technique described with reference to FIG. 2A. As the geometry of the desired regions to be removed is the same as the geometry of the channels 106, a common photomask can be used to form both masks (i.e., the mask used to form the channels 106 and the mask used to remove the portions 108 underneath the channels 106).

Referring to FIG. 7B, a selective etching technique is applied to the lower surface 104 of a differently configured substrate 100. In the embodiment of FIG. 7B, the substrate 100 is a stamped planar sheet metal that was formed according to the technique described with reference to FIG. 2B. The rear side etching process can be substantially similar as the technique of FIG. 7A except that the etching conditions are selected to remove the thicker vertically offset portions 108 of the substrate 100.

Referring to FIG. 7C, a planarizing technique is applied to the lower surface 104 of the planar sheet metal. In the embodiment of FIG. 7C, the substrate 100 is a stamped planar sheet metal that was formed according to the technique described with reference to FIG. 2B. The planarization technique uniformly removes material from the stamped substrate 100 until the bottom of the channels 106 is exposed. This may be done using a chemical polishing process, a mechanical polishing process (e.g., grinding) or a chemical-mechanical polishing (CMP) process, for example.

Figure 8:
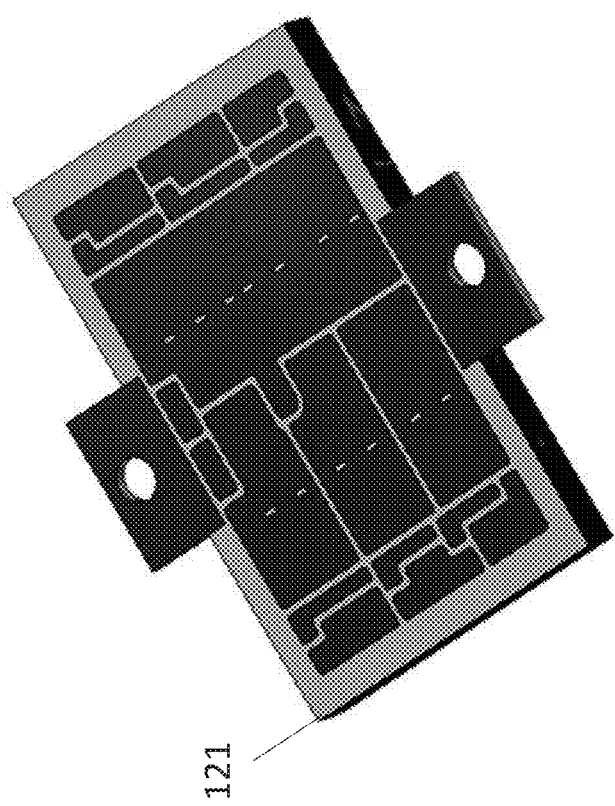
FIG. 8 illustrates a bottom side isometric view of the assembly after processing the rear side of the substrate to form electrically isolated islands, according to an embodiment

Referring to FIG. 8, after performing the rear side processing step, the islands 110 are completely separated and isolated from one another by the encapsulant material of the molded body 121 If desired, these islands 110 can be configured as electrical terminals for electrically accessing each terminal of the semiconductor dies 118 at the lower side of the module.

Figure 9:
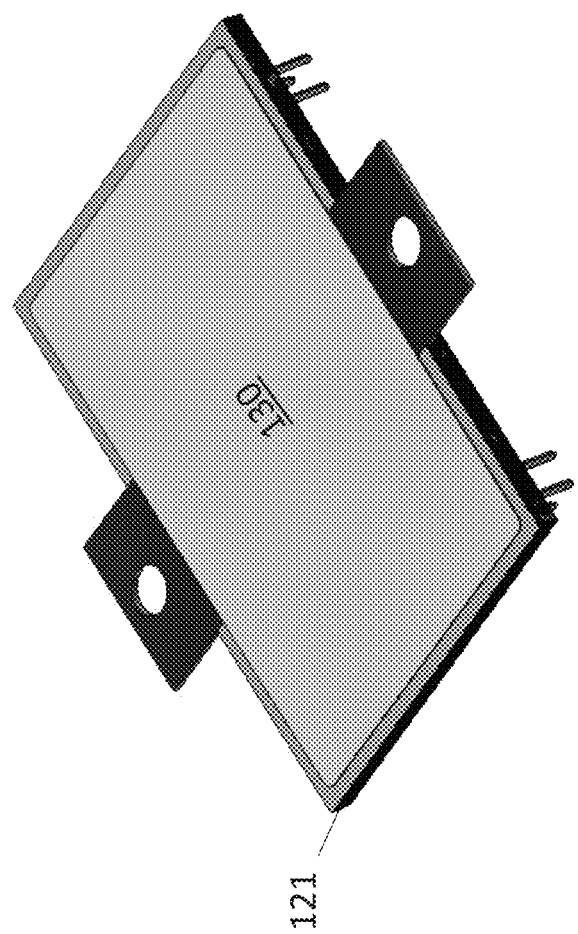
FIG. 9 illustrates a bottom side isometric view of the assembly after forming an electrically insulating layer on the electrically isolated islands, according to an embodiment.

As shown in FIG. 9, the lower surface 104 of the substrate 100 can be covered by a layer of electrically insulating material. As a result, the module can be mounted on an external apparatus, e.g., a heat sink, with the layer of electrically insulating material providing electrical isolation for each of the islands 110. Generally speaking, the layer of electrically insulating material may be any commercially available high-K packaging dielectric. According to an embodiment, the layer of electrically insulating material is or comprises a ceramic material. In another embodiment, the layer of electrically insulating material is or comprises an oxide layer that is deposited by oxidation in an electro-chemical or chemical process. In another embodiment, the layer of insulation material is or comprises particles and a matrix material. The Matrix material can be, e.g., epoxy, silicone or an acrylate. The particles can be e.g., from ceramic, coated metals, and glass. The particles can be mixed from two and more materials. The form of particles can be spherical, crushed spheres, plates and nail shapes. A thickness of the layer of electrically insulating material may be between 50 µm and 500 µm, for example, and may be between 150 µm and 250 µm in certain embodiments.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a power semiconductor module, the method comprising:
   providing a substrate of planar sheet metal;
   forming channels in an upper surface of the substrate that partially extend through a thickness of the substrate and define a plurality of islands in the substrate;
   mounting a first semiconductor die on a first one of the islands;
   forming a molded body of encapsulant that covers the substrate, fills the channels, and encapsulates the semiconductor die;
   forming a hole in the molded body and a recess in the upper surface of the substrate beneath the hole; and
   arranging a press-fit connector in the hole and forming a mechanical and electrical connection between an interior end of the press-fit connector and the substrate.

2. The method of claim 1, wherein forming the hole in the molded body and the recess in the upper surface comprises performing a single process step that completely penetrates the molded body and subsequently partially penetrates the substrate.

3. The method of claim 2, wherein the single process step comprises mechanical or laser drilling.

4. The method of claim 1, wherein forming the mechanical and electrical connection comprises welding the interior end of the press-fit connector to the substrate.

5. The method of claim 1, further comprising forming a spring contact attachment feature from the substrate, the spring contact attachment feature comprising a tab of the planar sheet metal and a perforation in the tab that completely extends through the thickness of the substrate, wherein the tab and the perforation protrude from the molded body of encapsulant after forming the molded body.

6. The method of claim 1, wherein forming the channels comprises forming one of the channels as an outer peripheral ring that separates each one of the islands from peripheral edges of the substrate.

7. The method of claim 1, wherein after forming the channels each one of the islands remain connected to one another by portions of the substrate that are directly beneath the channels, and wherein the method further comprises removing the portions of the substrate after forming the molded body such that each one of the islands are electrically isolated from one another.

8. The method of claim 7, wherein forming the channels comprises half-etching the upper surface of the substrate such that the portions of the substrate directly underneath the channels are thinner than the islands, and wherein removing the portions of the substrate comprises selectively etching the lower surface of the substrate.

9. The method of claim 7, wherein forming the channels comprises stamping the upper surface of the substrate such that the portions of the substrate directly underneath the channels are vertically offset from the islands, and wherein removing the portions of the substrate comprises selectively etching the lower surface of the substrate.

10. The method of claim 7, wherein forming the channels comprises stamping the upper surface of the substrate such that the portions of the substrate directly underneath the channels are vertically offset from the islands, and wherein removing the sections of the substrate comprises planarizing the lower surface of the substrate.

11. The method of claim 1, wherein the recess is formed in a second one of the islands, wherein the method further comprises:
    mounting a second semiconductor die on a second one of the islands;
    forming a plurality of the holes in the molded body and a plurality of the recesses in the upper surface of the substrate beneath each of the respective holes;
    providing a plurality of the press-fit connectors; and
    arranging one of the press-fit connectors in each one of the holes and forming a mechanical and electrical connection between an interior end of each of the press-fit connectors and the substrate,
    wherein the first and second semiconductor dies are configured as power transistors, and
    wherein the press-fit connectors are configured as externally accessible points of electrical contact to each terminal of the first and second semiconductor dies.

* * * * *